US008399156B2

(12) United States Patent
Tomari et al.

(10) Patent No.: US 8,399,156 B2
(45) Date of Patent: Mar. 19, 2013

(54) VOLUME PHASE HOLOGRAM RECORDING MATERIAL AND OPTICAL INFORMATION RECORDING MEDIUM USING THE SAME

(75) Inventors: Kohei Tomari, Kitakyushu (JP); Hidetaka Fujimatsu, Kitakyushu (JP); Kazuyoshi Masaki, Kitakyushu (JP); Takehiro Shimizu, Kitakyushu (JP); Yasuji Shichijo, Kitakyushu (JP)

(73) Assignee: Nippon Steel Chemical Co., Ltd., Tokyo (JP)

( * ) Notice: Subject to any disclaimer, the term of this patent is extended or adjusted under 35 U.S.C. 154(b) by 396 days.

(21) Appl. No.: 12/670,577

(22) PCT Filed: Jul. 22, 2008

(86) PCT No.: PCT/JP2008/063118
§ 371 (c)(1),
(2), (4) Date: Mar. 11, 2010

(87) PCT Pub. No.: WO2009/014112
PCT Pub. Date: Jan. 29, 2009

(65) Prior Publication Data
US 2010/0203429 A1 Aug. 12, 2010

(30) Foreign Application Priority Data

Jul. 26, 2007 (JP) ................................. 2007-194111
Feb. 14, 2008 (JP) ................................. 2008-032692

(51) Int. Cl.
*G03H 1/02* (2006.01)
(52) U.S. Cl. .............. 430/1; 430/2; 430/281.1; 430/290
(58) Field of Classification Search .................. None
See application file for complete search history.

(56) References Cited

U.S. PATENT DOCUMENTS 6,117,923 A * 9/2000 Amagai et al. ................ 523/440
2002/0142227 A1* 10/2002 Dhar et al. ........................ 430/1
(Continued)

FOREIGN PATENT DOCUMENTS

JP 2-3081 A 1/1990
JP 11-258402 * 9/1999
(Continued)

OTHER PUBLICATIONS

Satoh et al., "Novel $BF_3OEt_2$/R-OH Initiating System for Controlled Cationic Polymerization of Styrene in the Presence of Water", Macromolecules, vol. 34, 2001, pp. 396-401.

(Continued)

*Primary Examiner* — Martin Angebranndt
(74) *Attorney, Agent, or Firm* — Birch, Stewart, Kolasch & Birch, LLP

(57) ABSTRACT

Disclosed are a volume phase hologram recording material having high sensitivity, high contrast, and excellent multiple recording and record holding properties and a volume phase hologram recording medium using the same. The volume phase hologram recording material comprises mainly a polymer matrix (a), a radically photopolymerizable compound (b), and a radical photopolymerization initiator (c) and the polymer matrix is a three-dimensionally crosslinked or linear polymer matrix formed from a polymer matrix-forming material containing 0.5-50 wt % of an episulfide compound (f), an epoxy compound (g), and a curing agent (h).

12 Claims, 1 Drawing Sheet

U.S. PATENT DOCUMENTS

| | | |
|---|---|---|
| 2003/0022956 A1* | 1/2003 | Wanigatunga et al. ......... 522/25 |
| 2004/0114204 A1* | 6/2004 | Klug et al. ...................... 359/15 |
| 2006/0014081 A1* | 1/2006 | Hayase et al. .................... 430/1 |
| 2006/0172203 A1* | 8/2006 | Mizushima ....................... 430/1 |
| 2006/0177666 A1* | 8/2006 | Kawabe ...................... 428/411.1 |
| 2006/0194120 A1* | 8/2006 | Cole et al. ........................ 430/1 |
| 2007/0009807 A1 | 1/2007 | Azakami et al. |
| 2007/0030541 A1* | 2/2007 | Hayase et al. .................... 359/3 |
| 2007/0072089 A1* | 3/2007 | Sasao et al. ...................... 430/1 |
| 2007/0122742 A1* | 5/2007 | Kato et al. ................. 430/270.1 |
| 2007/0172742 A1* | 7/2007 | Yachi et al. ...................... 430/1 |
| 2009/0029181 A1* | 1/2009 | Shibasaki et al. ............. 428/457 |
| 2009/0053615 A1* | 2/2009 | Tomari et al. .................... 430/2 |
| 2009/0130568 A1* | 5/2009 | Tomari et al. .................... 430/2 |
| 2011/0092612 A1* | 4/2011 | Miki et al. ..................... 522/154 |

FOREIGN PATENT DOCUMENTS

| | | | |
|---|---|---|---|
| JP | 11-352303 A | | 12/1999 |
| JP | 2002-338564 | * | 11/2002 |
| JP | 2003-167331 | | 6/2003 |
| JP | 2004-0354413 | * | 2/2004 |
| JP | 2004-123873 A | | 4/2004 |
| JP | 2005-84262 | | 3/2005 |
| JP | 2005-275389 A | | 10/2005 |
| JP | 2007-17601 | | 1/2007 |
| JP | 2007-197578 | * | 8/2007 |
| WO | WO-2005/078531 A1 | | 8/2005 |

OTHER PUBLICATIONS

Trentler et al., "Epoxy Resin—Photopolymer Composites for Volume Holography", Chem. Mater., vol. 12, 2000, pp. 1431-1438.

* cited by examiner

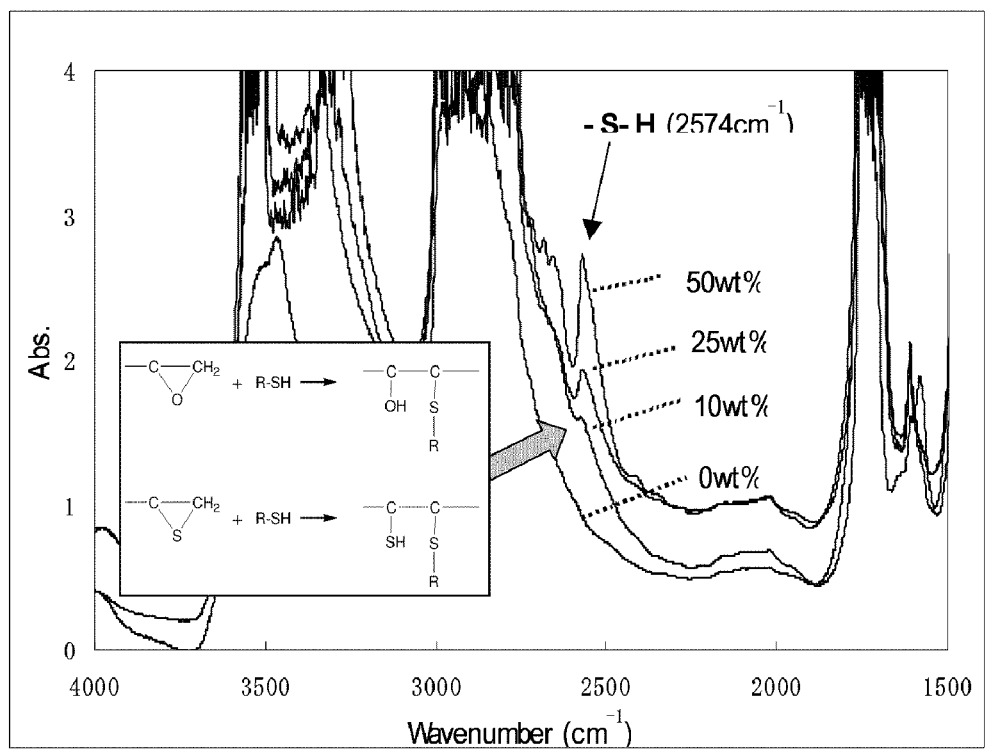

VOLUME PHASE HOLOGRAM RECORDING MATERIAL AND OPTICAL INFORMATION RECORDING MEDIUM USING THE SAME

TECHNICAL FIELD

This invention relates to a material suitable for volume phase hologram recording that records and reproduces information with the use of a coherent active energy ray and to an optical information recording medium using the same.

BACKGROUND TECHNOLOGY

Hologram information recording is a system for recording and reproducing information as two-dimensional page data and it is capable of improving the recording density and transmission speed sharply compared with a bit data system such as DVD. For this reason, intensive researches and developmental works are being conducted on hologram information recording as one of the next-generation optical information recording systems.

In particular, an optical information recording medium using a volume phase hologram recording material (hereinafter the former may also be referred to simply as hologram recording medium and the latter as hologram recording material) shows a diffraction efficiency of 1 which is the theoretical maximum and allows overwriting of information (multiple recording) and, because of these properties, the medium is expected to be put to practical use as a high-density information recording medium. Photopolymers are frequently used for hologram recording materials in consideration of simplicity in production of recording media and diversity in selection of raw materials.

Irradiation of a hologram recording medium containing a radically photopolymerizable component and a radical photopolymerization initiator simultaneously with a reference light and an information light, both consisting of a coherent active energy ray, generates an interference pattern composed of alternate light and dark areas; then, a polymerization reaction is induced to occur in the light areas and the polymerizable component diffuses in the direction to relax or destroy the concentration gradient formed by the polymerization reaction or diffuses from the dark areas to the light areas of the interference pattern. On the other hand, the non-reactive component diffuses in the direction to compensate for the diffusion of the polymerizable component, that is, in the reverse direction from the light areas to the dark areas of the interference pattern. In this manner, each component is distributed by concentration in the hologram recording layer in correspondence to the light intensity of the interference pattern and this concentration distribution is recorded as modulation structure of the refractive index.

The recording capacity of a hologram recording medium is, in principle, proportional to the thickness of a hologram recording layer. Therefore, it is advantageous that a hologram recording layer is formed as thickly as possible within a range where the influence of absorption of light by the material or the volume shrinkage accompanying the polymerization reaction on the recording performance can be substantially tolerated. The thickness demanded in practice for a hologram recording layer ranges approximately from 200 μm to 2 mm, and this is extremely thick compared with the conventional optical information recording media.

The patent document 1 discloses a substantially solid photopolymerizable composition which forms an image of refractive index upon exposure to a chemically-acting radiation, the said exposure constituting the one and only treating step, and substantially comprises 25-75% of a solvent-soluble, thermoplastic polymer binder (a), 5-60% of a liquid ethylenic unsaturated monomer (b), and 0.1-10% of a photoinitiator (c) which activates the polymerization of the unsaturated monomer upon exposure to a chemically-acting radiation. A solvent is used here to dissolve each component uniformly and to reduce the viscosity of the composition to such a degree as to allow application to a substrate. A hologram recording layer is formed by application of the composition to a substrate and, as a step for drying is required to remove the solvent by evaporation, the thickness of the recording layer has been limited substantially to 100 μm or below.

Several disclosures have been made on hologram recording materials capable of forming a hologram recording layer in a relatively large thickness amounting to approximately 200 μm or more without need of a solvent, hologram recording media using the same, and methods for preparing these materials and media. For example, some of such disclosures relate to a three-dimensionally crosslinked polymer matrix formed in-situ in the step for forming a hologram recording layer (the patent documents 2 to 4, the non-patent document 1, and elsewhere).

The three-dimensionally crosslinked polymer matrix here is considered to play roles of providing a hologram recording material with such physical strength as to maintain the shape as a hologram recording layer, of suppressing excessive migration of polymerizable compounds, and of reducing the volume shrinkage accompanying the polymerization during hologram recording (the non-patent document 1).

The patent document 2 discloses an optical product consisting of a three-dimensionally crosslinked polymer matrix and one kind or plural kinds of optically active monomers wherein the matrix polymer is compatible with a polymer formed by the polymerization of the optically active monomers. Further, an optical product is disclosed wherein the three-dimensionally crosslinked polymer matrix is formed by a polymerization reaction which is independent of the polymerization reaction of the optically active monomers.

The hologram recording medium of the aforementioned constitution does not require a solvent in the formation of a hologram recording layer and has an advantage in that a layer with a thickness ranging from several hundred microns to several millimeters can be formed relatively easily.

A hologram recording medium is required to be highly transparent. Therefore, it is necessary that the three-dimensionally crosslinked polymer matrix is compatible with the polymerizable monomers and with the polymers formed from the said polymerizable monomers.

However, this condition for compatibility is satisfied only by a limited number of polymer matrix-monomer combinations. Moreover, even a matrix polymer-monomer combination satisfying the condition for compatibility faces a problem that the difference in refractive index between the matrix polymer and the monomer or between the matrix polymer and the polymer formed from the said monomer cannot be made large.

In hologram information recording, the data recorded as an interference pattern are fixed completely by a treatment for fixation such as post-exposure. In continuous recording of a large volume of data, the time passing from the start of recording to the end of fixation becomes long and the data recorded earlier may in the meantime deteriorate. Therefore, a hologram recording medium is required to prevent the data recorded at least in the prescribed time from continuous recording to fixation from deteriorating (this property is hereinafter referred to as record holding property).

However, the problem with the optical products disclosed in the aforementioned patent documents is an insufficient record holding property.

The patent document 3 discloses a volume phase hologram recording material wherein the said material comprises a polymer matrix that has a three-dimensionally crosslinked structure containing a plurality of reactive groups and is capable of recording an interference fringe generated by the interference of a coherent light by the difference in refractive index and the material contains no polymerizable monomer as a component in hologram recording.

The patent document 4 discloses a photosensitive composition for volume phase hologram recording which comprises a compound having one or more active methylene groups in the molecule or a compound having two or more active methylene groups in the molecule, a compound having two or more groups to which an active methylene group or a carboanion formed therefrom adds nucleophilically, a Michael reaction catalyst, a photopolymerizable compound, and a photopolymerization initiator.

The hologram recording materials disclosed in the aforementioned patent documents show some improvement in the record holding property, but cannot be said to have sufficient sensitivity.

As described above, several hologram recording materials containing a three-dimensionally crosslinked polymer matrix formed in the step for forming a hologram recording layer have been disclosed thus far, but none has been offered that has high sensitivity, high contrast, and a good record holding property.

Patent document 1: JPH02-3081 A
Patent document 2: JPH11-352303 A
Patent document 3: WO2005/078531 A
Patent document 4: JP2005-275389 A
Patent document 5: JP2004-123873 A
Non-patent document 1: Chemistry of Materials, Vol. 12, pp. 1431-1438 (2000)
Non-patent document 2: Macromolecules, 34, pp. 396-401 (2001)

DISCLOSURE OF THE INVENTION

Problems to be Solved by the Invention

An object of this invention is to provide a volume phase hologram recording material having high sensitivity, high contrast, and excellent multiple recording and record holding properties and to provide further a volume phase hologram recording medium using the same.

Means to Solve the Problems

This invention relates to a volume phase hologram recording material comprising mainly a polymer matrix (a), a radically photopolymerizable compound (b), and a radical photopolymerization initiator (c) wherein the polymer matrix (a) is a polymer matrix having a thiol group formed from a polymer matrix-forming material comprising 0.5-50 wt % of an episulfide compound (f) containing one or more thiirane rings in the molecule, an epoxy compound (g) containing one or more oxirane rings and no thiirane rings in the molecule, and a curing agent (h).

The aforementioned polymer matrix (a) is preferably a three-dimensionally crosslinked polymer matrix or linear polymer matrix having a thiol group. Here, the linear polymer matrix can be prepared from a polymer matrix-forming material (g) comprising 0.5-50 wt % of an episulfide compound (f2) containing two or less thiirane rings in the molecule, an epoxy compound (g2) containing two or less oxirane rings and no thiirane rings in the molecule, and a bifunctional curing agent (h3).

The episulfide compound (f) containing one or more thiirane rings in the molecule or the episulfide compound (f2) containing two or less thiirane rings in the molecule is preferably a compound which has a group represented by the following formula (1) in the molecule and has a molecular weight of 800 or less.

(1)

In formula (1), $R^1$ is a linear hydrocarbon group of 1 to 10 carbon atoms or a single bond, $R^2$, $R^3$, and $R^4$ each is a linear hydrocarbon group of 1 to 10 carbon atoms or a hydrogen atom and Y is O or S.

The polymer matrix-forming material is preferably a mixture of two kinds of more of compounds including a combination which provides a difference in refractive index of 0.05 or more in absolute value. Furthermore, the volume phase hologram recording material preferably contains at least one kind of non-reactive compound (d) which is compatible with the polymer matrix (a).

The radically photopolymerizable compound (b) is preferably obtained by polymerizing monomers containing a divinyl aromatic compound and a monovinyl aromatic compound, has 10-70 mol % of a structural unit derived from the divinyl aromatic compound and represented by the following formula (2) and 10-70 mol % of a structural unit derived from the monovinyl aromatic compound, and contains 0.5-30 wt % of a soluble aromatic copolymer (b1) having a number average molecular weight ($M_n$) of 300-30,000 and a molecular weight distribution ($M_w/M_n$) of 10 or less. Here, a monovinyl aromatic compound suitable as a constituent of the soluble aromatic copolymer (b1) is an aromatic olefin selected from styrene, vinylnaphthalene, vinylbiphenyl, indene, acenaphthylene, benzothiophene, and derivatives thereof.

(2)

In formula (2), $R^5$ is an aromatic hydrocarbon group of 6 to 30 carbon atoms.

This invention further relates to an optical information recording medium for volume phase hologram recording formed by providing the aforementioned volume phase hologram recording material on a substrate or between two substrates.

Further, this invention relates to a volume phase hologram recording material precursor comprising mainly a polymer matrix-forming material, a radically photopolymerizable compound (b), and a radical photopolymerization initiator (c) wherein the polymer matrix-forming material comprises 0.5-50 wt % of an episulfide compound (f) containing one or more thiirane rings in the molecule, an epoxy compound (g) containing one or more oxirane rings and no thiirane rings in the molecule, and a curing agent (h) and forms a polymer matrix by a polymerization reaction other than a radical photopolymerization reaction.

In the aforementioned volume phase hologram recording material precursor, the polymer matrix-forming material may be a polymer matrix-forming material (g) which comprises 0.5-50 wt % of an episulfide compound (f2) containing two or less thiirane rings in the molecule, an epoxy compound (g2) containing two or less oxirane rings and no thiirane rings in the molecule, and a bifunctional curing agent (h2) and forms a linear polymer matrix having a reactive secondary thiol group by a polymerization reaction other than a radical photopolymerization reaction.

Still further, this invention relates to a method for preparing a volume phase hologram recording material which comprises converting the aforementioned volume phase hologram recording material precursor to a three-dimensionally crosslinked polymer matrix having a thiol group by a polymerization reaction other than a radical photopolymerization reaction.

BRIEF DESCRIPTION OF THE DRAWING

FIG. 1 shows the results of FT-IR measurements performed on a volume phase hologram recording material prepared according to this invention.

PREFERRED EMBODIMENTS OF THE INVENTION

The volume phase hologram recording material of this invention comprises mainly a polymer matrix (a), a radically photopolymerizable compound (b), and a radical photopolymerization initiator (c). The volume phase hologram recording material precursor of this invention comprises mainly a polymer-matrix forming material, a radically photopolymerizable compound (b), and a radical photopolymerization initiator (c).

The polymer matrix also functions as a binder and it may be referred to as a binder. The polymer matrix may be three-dimensionally crosslinked or linear. In the preparation of a linear polymer matrix, the number of functional groups in the episulfide compound, the epoxy compound, and the curing agent is respectively 2 or less. In the preparation of a three-dimensionally crosslinked polymer matrix, this number is in excess of 2 on the average.

In the following description, the polymer matrix may also be referred to as component (a), the polymer matrix-forming material as component (A), the radically photopolymerizable compound as component (b), and the radical photopolymerization initiator as component (c). The component (a) contains the following components (f) to (h): the component (f) is an episulfide compound containing one or more thiirane rings in the molecule; the component (g) is an epoxy compound containing one or more oxirane rings and no thiirane rings in the molecule; and the component (h) is a curing agent. The component (f) may also be referred to as an episulfide compound and the component (g) as an epoxy compound and one or both of the epoxy compound and the episulfide compound may be referred to an epoxy compound (episulfide compound). The component (h) may also be referred to as a curing agent and acts to cure an epoxy compound (episulfide compound). In the case where the polymer matrix is linear, such a linear polymer matrix is prepared from a polymer matrix-forming material comprising an episulfide compound (f2) containing two or less thiirane rings in the molecule, an epoxy compound (g2) containing two or less oxirane rings and no thiirane rings in the molecule, and a bifunctional curing agent (h2). These compounds are respectively referred to as component (f2), component (g2), and component (h2). The components (f2), (g2), and (h2) are respectively understood to be a lower concept of the components (f), (g), and (h). The polymer matrix will be explained below; the features common to the three-dimensionally crosslinked polymer matrix and the linear polymer matrix will be explained in the part relating to the former and then the linear polymer matrix will be explained.

According to this invention, it is advantageous to prepare a volume phase hologram recording material by subjecting a volume phase hologram recording material precursor (hereinafter also referred to as hologram recording material precursor) to a polymerization reaction other than a radical photopolymerization reaction thereby forming the aforementioned three-dimensionally crosslinked polymer matrix having radically photopolymerizable groups.

In this invention, it is preferable to form the three-dimensionally crosslinked polymer matrix in-situ during the formation of a hologram recording layer. It is advantageous to form the three-dimensionally crosslinked polymer matrix during the formation of a hologram recording layer using the hologram recording material precursor. In this case, the three-dimensionally crosslinked polymer matrix is formed in the condition where the matrix-forming material, the radically photopolymerizable compound or component (b), and the radical photopolymerization initiator or component (c) coexist. In this condition, the performance as a hologram recording material deteriorates when the radically polymerizable groups in the component (b) react simultaneously and it is preferable to form a hologram recording layer while decreasing the radically photopolymerizable groups in the component (b) as little as possible even in the presence of the component (c). The term polymerization as used in this specification includes not only polymerization in which unsaturated groups participate but also condensation and polyaddition. The term radical photopolymerization includes the case where the polymerization is carried out in the presence of a photopolymerization initiator and the same holds for radically photopolymerizable groups. A functional group having an olefinic double bond is suitable for a photopolymerizable functional group. There may be a case where radical photopolymerization is abbreviated to radical polymerization.

Examples of the reaction to form a three-dimensionally crosslinked polymer matrix without substantially decreasing radically photopolymerizable groups include an epoxy (episulfide)-amine polyaddition reaction and an epoxy (episulfide)-thiol polyaddition reaction, both of which differ from radical photopolymerization in the mode of reaction. An advantageous choice is the epoxy (episulfide)-thiol polyaddition, but is not limited thereto. In order to form a three-dimensionally crosslinked polymer matrix without substantially decreasing radically photopolymerizable groups, it is preferable to select adequate reaction catalysts or control the reaction temperature so that a polymerization other than a radical photopolymerization may proceed preferentially.

Conversion of an epoxy resin (episulfide resin) obtained by the epoxy (episulfide)-thiol polyaddition reaction to a three-dimensionally crosslinked polymer matrix is explained as an example. An episulfide compound, an epoxy compound, and a curing agent (advantageously a polythiol compound) constitute a polymer matrix-forming material. For the formation of a three-dimensionally crosslinked polymer matrix, at least one of the episulfide compound, the epoxy compound, and the curing agent contains two or more epoxy groups, episulfide groups, or thiol groups on the average. For the formation of a linear polymer matrix having a reactive thiol group, it is preferable that the episulfide compound and the epoxy compound have two epoxy groups or two episulfide groups on the average and the curing agent has a bifunctional reactive group.

An episulfide compound containing one or more thiirane rings in the molecule is used as an episulfide compound or component (f). Preferably, it is a compound that has a group represented by the aforementioned formula (1) in the molecule and has a molecular weight of 800 or less. In formula (1), $R^1$ is a divalent linear hydrocarbon group of 1 to 10 carbon atoms or a single bond. Such divalent linear hydrocarbon groups are preferably alkylene groups of 1 to 3 carbon atoms and, more preferably, a methylene group. The groups $R^2$, $R^3$, and $R^4$ each is independently a linear hydrocarbon group of 1 to 10 carbon atoms or a hydrogen atom, preferably a hydrogen atom. When it is a linear hydrocarbon group, it is preferably an alkyl group of 1 to 3 carbon atoms. Y is O or S.

A wide variety of episulfide compounds can be obtained easily by the O/S conversion reaction of the epoxy compounds cited as examples of the component (g) below and a suitable episulfide compound may be selected from them for use in this invention. Preferable examples of episulfide compounds include episulfide compounds obtained by the O/S conversion of tripropylene glycol diglycidyl ether, bisphenol A diglycidyl ether, bis-2,2-hydroxycyclohexylpropane diglycidyl ether, and bisphenol fluorene diglycidyl ether. These episulfide compounds may be used singly or as a mixture of two kinds or more. The reaction for conversion of oxygen in the oxirane ring to sulfur can be carried out under the publicly known conditions. In this case, the condition may be chosen so that a part of oxygen in the oxirane ring is converted to sulfur, but it is preferable to choose the condition so that one or more oxygens are converted to sulfur per one molecule of the raw material epoxy compound. In the case where the unchanged epoxy compound is included, it is counted as epoxy compound. An episulfide compound containing two or less thiirane rings in the molecule is used as an episulfide compound or component (f2).

It is necessary to control the proportion of the episulfide compound or component (f) in the component (a) at 0.5-50 wt %, preferably at 7-20 wt %. Where the proportion is less than 0.5 wt %, no improvement is observed in the record holding property. Where the proportion exceeds 50 wt %, the sensitivity drops.

The epoxy compounds suitable for the component (g) are polyfunctional epoxy compounds containing two or more oxirane rings in the molecule. Such polyfunctional epoxy compounds include aliphatic epoxy compounds such as 1,6-hexanediol diglycidyl ether, ethylene glycol diglycidyl ether, diethylene glycol diglycidyl ether, triethylene glycol diglycidyl ether, tetraethylene glycol diglycidyl ether, propylene glycol diglycidyl ether, dipropylene glycol diglycidyl ether, tripropylene glycol diglycidyl ether, tetrapropylene glycol diglycidyl ether, neopentyl glycol diglycidyl ether, neopentyl glycol hydroxy pivalate diglycidyl ether, trimethylolpropane diglycidyl ether, trimethylolpropane triglycidyl ether, glycerol diglycidyl ether, glycerol triglycidyl ether, diglycerol diglycidyl ether, diglycerol triglycidyl ether, diglycerol tetraglycidyl ether, pentaerythritol diglycidyl ether, pentaerythritol triglycidyl ether, pentaerythritol tetraglycidyl ether, dipentaerythritol tetraglycidyl ether, sorbitol tetraglycidyl ether, tris(2-hydroxyethyl)isocyanate diglycidyl ether, and tris(2-hydroxyethyl)isocyanate triglycidyl ether, alicyclic epoxy compounds such as isophorone diol diglycidyl ether and hydrogenated bisphenol A diglycidyl ether, and aromatic epoxy compounds such as bisphenol A diglycidyl ether, bisphenol F diglycidyl ether, orthophthalic acid diglycidyl ether, phenol novolak polyglycidyl ether, and cresol novolak polyglycidyl ether. These epoxy compounds may be used singly or as a mixture of two kinds or more.

Of the aforementioned epoxy compounds, aliphatic epoxy compounds such as 1,6-hexanediol diglycidyl ether, diethylene glycol diglycidyl ether, triethylene glycol diglycidyl ether, and tripropylene glycol diglycidyl ether and alicyclic epoxy compounds such as hydrogenated bisphenol A diglycidyl ether are used preferably.

The epoxy compounds suitable for the component (g2) are epoxy compounds containing two or less oxirane rings in the molecule. Examples are aliphatic epoxy compounds such as 1,6-hexanediol diglycidyl ether, ethylene glycol diglycidyl ether, diethylene glycol diglycidyl ether, triethylene glycol diglycidyl ether, tetraethylene glycol diglycidyl ether, propylene glycol diglycidyl ether, dipropylene glycol diglycidyl ether, tripropylene glycol diglycidyl ether, tetrapropylene glycol diglycidyl ether, neopentyl glycol diglycidyl ether, neopentyl glycol hydroxy pivalate diglycidyl ether, trimethylolpropane diglycidyl ether, glycerol diglycidyl ether, diglycerol diglycidyl ether, pentaerythritol diglycidyl ether, and tris(2-hydroxyethyl)isocyanate diglycidyl ether, alicyclic epoxy compounds such as isophorone diol diglycidyl ether and hydrogenated bisphenol A diglycidyl ether, and aromatic epoxy compounds such as bisphenol A diglycidyl ether, bisphenol F diglycidyl ether, and orthophthalic acid diglycidyl ether, but are not limited thereto. These epoxy compounds may be used singly or as a mixture of two kinds or more.

Of the aforementioned epoxy compounds, aliphatic epoxy compounds such as 1,6-hexanediol diglycidyl ether, diethylene glycol diglycidyl ether, triethylene glycol diglycidyl ether and tripropylene glycol diglycidyl ether and alicyclic epoxy compounds such as hydrogenated bisphenol A diglycidyl ether are used preferably.

The proportion of the epoxy compound or component (g) in the component (a) is 40-90 wt %, preferably 50-80 wt %.

A curing agent to serve as the component (h) can be selected from ordinary epoxy curing agents. In this invention, however, it is necessary to use a compound which can cure at a temperature as low as possible (approximately 80° C. or below) in order to form a three-dimensionally crosslinked polymer matrix without substantially decreasing radically polymerizable groups of the radically photopolymerizable compound or component (c). Preferable compounds include amine compounds, polythiol compounds, and acid anhydrides. More preferable compounds are polythiol compounds. A polythiol compound containing two or more thiol groups in the molecule or a mixture of such polythiol compounds is used. Examples include trimethylolpropane tris(3-mercaptopropionate), pentaerythritol tetrakis(3-mercaptopropionate), dipentaerythritol hexakis(3-mercaptopropionate), and tris[(3-mercaptopropionyloxy)-ethyl]isocyanurate. These thiol compounds may be used singly or as a mixture of two kinds or more.

A bifunctional curing agent to serve as the component (h2) can be selected from ordinary epoxy curing agents. In this invention, however, it is necessary to use a compound which can cure at a temperature as low as possible (approximately 80° C. or below) in order to form a three-dimensionally crosslinked polymer matrix without substantially decreasing radically polymerizable groups of the radically photopolymerizable compound or component (c). Preferable compounds include amine compounds, primary thiol compounds, and acid anhydrides. More preferable compounds are primary thiol compounds. A thiol compound containing two or less primary thiol groups in the molecule or a mixture of such thiol compounds is used. Examples include ethylene glycol bisthioglycolate (EGTG), butanediol bisthioglycolate (BDTG), ethylene glycol bisthiopropionate (EDTP), butanediol bisthiopropionate (BDTP), dimercaptotriethylene disulfide (DMTDS), dimercaptodiethylene sulfide (DMDS), 1,10-decanedithiol, m-xylylenedithiol, and p-xylylenedithiol, but are not limited thereto. These curing agents may be used singly or as a mixture of two kinds or more.

Regarding the proportion of the curing agent or component (h) in the component (a), it is preferable to control the equivalent ratio of the component (h) to the sum of the components (f) and (g) at 40:60 to 60:40, preferably 45:55 to 55:45.

It is allowable to use two kinds or more of compounds for the component (f), (g), or (h). However, it is preferable that one or more combinations of these compounds show a difference in refractive index of 0.05 or more.

According to this invention, a volume phase hologram recording material is used for the purpose of recording information by utilizing the contrast in refractive index between the exposed area and the unexposed area and, in a volume phase hologram recording medium prepared from the said material, at least a part of the contrast in refractive index between the exposed area and the unexposed area is formed by diffusion of a part of the radically photopolymerizable compound or component (b) to the exposed area after exposure. When this contrast in refractive index is high, the intensity of signal increases at the time of read out of the hologram. Hence, it is desirable in principle that the difference in refractive index between the diffusing photopolymerizable monomer and the polymer matrix is large. However, in the case where the radically photopolymerizable compound consists of low-molecular-weight monomers, the said compound continues to diffuse gradually after the exposure required for recording is stopped and this results in deterioration of the important properties of a hologram such as the record holding property and the multiple recording property.

According to this invention, it is possible to introduce thiol groups freely in the polymer matrix by using an episulfide compound as a part of the polymer matrix-forming material. These thiol groups in the matrix generate thiyl radicals at the time of hologram recording and bind to the radically photopolymerizable compound or act as a chain transfer agent: as a result, the compatibility of the three-dimensionally crosslinked polymer matrix with the radically photopolymerizable compound increases and the differences in refractive index of these reaction mixtures come nearer. For this reason, the intensity of signal at the time of read out is controlled and kept from becoming too high, the multiple recording property is improved, and the turbidity-free condition is maintained for a long period of time.

In the volume phase hologram recording medium formed from the volume phase hologram recording material of this invention, a part of the contrast in refractive index between the exposed area and the unexposed area is formed by the diffusion of a part of the photoradically polymerizable compound to the exposed area after exposure. As a high contrast in refractive index increases the intensity of signal at the time of read out of a hologram, it is desirable to make the difference in refractive index between the diffusing radically photopolymerizable compound and the polymer matrix large. However, when the difference in refractive index between the polymer matrix and the radically photopolymerizable compound is too large, the scattering at the interface becomes excessive and turbidity is generated with the resultant drop in the recording property. According to this invention, the refractive index of the polymer matrix can be adjusted by using a mixture of two kinds or three kinds or more of compounds including a combination which provides a difference in refractive index of 0.05 or more in absolute value as a polymer matrix-forming material and it is thus possible to keep the difference in refractive index between the polymer matrix and the radically photopolymerizable compound under control so that the intensity of signal becomes high at the time of read out and the turbidity-free condition is maintained.

The reaction for forming the polymer matrix without substantially decreasing the radically polymerizable groups can be accelerated by the use of a suitable catalyst. The catalysts useful for this purpose include tertiary amines, tertiary aminophenols, borates, imidazolium salts, sulfonium salts, iodonium salts, phosphonium salts, and phosphorus compounds. For example, a phenol such as 2,4,6-tris(dimethylaminomethyl)phenol, 1,4-diazabicyclo[2,2,2]octane (DABCO), an imidazole derivative, or a tertiary amine such as 2,4,6-tris (dimethylaminomethyl)phenol and N,N-dimethylbenzylamine may be used as a catalyst for the epoxy(episulfide)-thiol polyaddition reaction. These catalysts may be used singly or as a mixture of two kinds or more.

The curing catalyst is used at a rate of 0.01-15 parts by weight, preferably 0.1-10 parts by weight, per 100 parts by weight of the sum of the episulfide compound and the epoxy compound.

To form a linear polymer matrix having a reactive secondary thiol group from the material containing the aforementioned components (f), (g), and (h), the epoxy groups in the components (f) and (g) are allowed to react selectively with the curing agent or component (h). A linear polymer matrix is formed when the epoxy groups and the curing agents are substantially bifunctional. The linear polymer matrix thus obtained has secondary hydroxyl groups and secondary thiol groups, but these groups do not react substantially because of their low reactivity. This linear polymer matrix constitutes the polymer matrix.

In addition to the aforementioned component (a), a radically photopolymerizable compound or component (b) and a radical photopolymerization initiator or component (c) are incorporated in the hologram recording material of this invention. Irradiation with light generates radicals from the thiol group in the components (a) and from the component (c) and the radicals cause the component (b) to polymerize. It is desirable here that the polymer formed from the component (b) or the component (b) itself is compatible with the polymer matrix or component (a) to show high transparency. The use of a suitable compound for the component (b) can increase further the sensitivity of the hologram recording material and the contrast of recorded data.

The radically polymerizable compound or component (b) starts a radical polymerization reaction by a coherent active energy ray commonly used in hologram recording to form a polymer compatible with a three-dimensionally crosslinked polymer matrix and its examples include compounds having an acryloyl group, a methacryloyl group, a vinyl group, or an isopropenyl group. Furthermore, it is preferable that the radically photopolymerizable compound partly contains a soluble aromatic copolymer (b1).

The so-called radically polymerizable monomers or oligomers are preferably used as the radically polymerizable compound or component (b) and radically polymerizable monomers (or oligomers) containing an aromatic ring or a sulfur atom in the molecule and showing a high refractive index are used more preferably. Such compounds include styrene, chlorostyrene, bromostyrene, α-methylstyrene, divinylbenzene, diisopropenylbenzene, vinylnaphthalene, divinylnaphthalene, vinylbiphenyl, divinylbiphenyl, indene, acenaphthylene, N-vinylcarbazole, N-vinylpyrrolidone, phenyl(meth)acrylate, benzyl(meth)acrylate, phenoxyethyl(meth)acrylate, tribromophenyl(meth)acrylate, tribromophenoxyethyl (meth)acrylate, alkylene oxide-modified bisphenol A di(meth)acrylate, 9,9-bis(4-hydroxyphenyl)fluorene di(meth)acrylate, 9,9-bis(4-hydroxy-3-methylphenyl)fluorene di(meth)acrylate, 9,9-bis[4-(2-hydroxyethyl)phenyl] fluorene di(meth)acrylate, bis(2-methacryloylthioethyl)sulfide, and bis(4-methacryloylthiophenyl)sulfide. These radically polymerizable monomers (or oligomers) may be used singly or as a mixture of two kinds or more.

The soluble polyfunctional aromatic copolymer (b1) has a structural unit derived from a divinyl aromatic compound and a structural unit derived from a monovinyl aromatic compound and contains 10-70 mol % of the structural unit represented by the aforementioned formula (2); a soluble aromatic copolymer of this structural unit is also referred to simply as a copolymer (b1). The structural unit represented by the aforementioned formula (2) is derived from a divinyl aromatic compound. Therefore, explanation of a divinyl aromatic compound to be used will help one understand the nature of $R^1$ in formula (2). A divinyl aromatic compound is known to yield the structural unit represented by formula (2) and some other structural units such as a branched or crosslinked structure. As an increase in the crosslinked structure decreases the solubility, the reaction conditions are controlled so that the structural unit represented by formula (2) becomes the principal structure. The methods for preparing such soluble polyfunctional aromatic vinyl copolymer are described in the patent document 5, the non-patent document 2, and elsewhere.

Advantageously, the copolymer (b1) contains 10-70 mol % of the structural unit derived from a divinyl aromatic compound and represented by the aforementioned formula (2) and 10-70 mol % of the structural unit derived from a monovinyl aromatic compound and shows a number average molecular weight ($M_n$) of 300-30,000 and a molecular weight distribution ($M_w/M_n$) of 10 or less.

The basic skeleton of the copolymer (b1) is obtained by polymerizing a raw material containing a divinyl aromatic compound and a monovinyl aromatic compound in the presence of a catalyst, preferably in the presence of a Lewis acid. Such a raw material for polymerization contains 20-90 mol %, preferably 40-80 mol %, of a divinyl aromatic compound and 10-80 mol %, preferably 20-60 mol %, of a monovinyl aromatic compound. If necessary, it is allowable to use other olefinic compounds in an amount of 30 mol % or less, preferably 10 mol % or less. The structural unit here means a unit derived from one monomer existing in the polymer.

Examples of the divinyl aromatic compound include m-divinylbenzene, p-divinylbenzene, 1,2-diisopropenylbenzene, 1,3-divinylnaphthalene, 4,4'-divinylbiphenyl, and 1,2-divinyl-3,4-dimethylbenzene, but are not limited thereto. These divinyl aromatic compounds may be used singly or as a mixture of two kinds or more.

Examples of the monovinyl aromatic compound include styrene, vinylnaphthalene, and vinylbiphenyl and derivatives thereof. The derivatives are compounds formed by introducing a substituent such as an alkyl group, an alkoxyl group, a halogen atom, a phenyl group, and a hydroxyl group to the aromatic ring of the foregoing monovinyl aromatic compounds. In addition, the derivatives include compounds in which the aforementioned substituent is introduced to the α or β position of the vinyl group in the monovinyl aromatic compounds. Further, a monovinyl aromatic compound in which the vinyl group constitutes a part of the ring-forming carbon atoms and its examples include aromatic olefins and derivatives thereof such as indene, acenaphthylene, and benzothiophene.

The monovinyl aromatic compounds are not limited to those described above. Of these monovinyl aromatic compounds, aromatic vinyl compounds in which an alkyl group is substituted on the ring or at the α position are preferred because they yield a large amount of an indane structure in the skeleton of the copolymer during polymerization. From the viewpoint of cost and the heat resistance of the resulting polymer, preferable examples include ethylvinylbenzene (both m- and p-isomers), ethylvinylbiphenyl (including isomers), and ethylvinylnaphthalene (including isomers).

The copolymer (b1) is obtained by the copolymerization of a divinyl aromatic compound and a monovinyl aromatic compound such as those described above and, if necessary, other cationically polymerizable monomers may be used. Such other monomers include trivinyl aromatic compounds, dienes such as butadiene and isoprene, and vinyl compounds such as alkyl vinyl ethers, isobutene, diisobutylene and sulfur-containing vinyl compounds.

The copolymer (b1) is synthesized basically by a method based on common cationic polymerization with the use of a Lewis acid catalyst. For example, a preferable method is described in the non-patent document 2.

The number average molecular weight $M_n$ (obtained by gel permeation chromatography and calibrated against standard polystyrene) is preferably 300-30,000, more preferably 500-5,000. When $M_n$ is less than 300, the copolymer (b1) becomes too low in viscosity and its processability deteriorates. On the other hand, when $M_n$ is 30,000 or more, rapid material transfer is hindered. The molecular weight distribution ($M_w/M_n$) is preferably 10 or less. When the molecular weight distribution exceeds 10, there may arise problems such as deterioration of the processability of the copolymer (b1) and generation of gels.

The radically polymerizable monomer in the component (b) to be incorporated is preferably 0.5-30 wt %, more preferably 1-10 wt %, of the component (a). Moreover, the amount of the copolymer (b1) to be incorporated is preferably 0.5-70 wt %, more preferably 5-30 wt %, of the component (b) as a whole. When the concentration of radically polymerizable groups is excessively high, the volume change (shrinkage) of a hologram recording layer at the time of hologram recording exceeds the allowed range and there may arise a possibility that the recorded data deteriorate or the curing of the hologram recording layer accompanying hologram recording proceeds excessively to harm the sensitivity, particularly in multiple recording. On the other hand, when the concentration of radically polymerizable groups is too low, sufficient diffraction efficiency may not be obtained or the record holding property may deteriorate.

The amount of the radically polymerizable compound or component (b) to be incorporated is preferably 0.5-30 wt %, more preferably 1-10 wt %, of the component (a). When the concentration of radically polymerizable groups is excessively high, the volume change (shrinkage) of a hologram recording layer at the time of hologram recording exceeds the allowed range and there may arise a possibility that the recorded data deteriorate or the curing of the hologram recording layer accompanying hologram recording proceeds excessively to harm the sensitivity, particularly in multiple recording. On the other hand, when the concentration of radically polymerizable groups is too low, sufficient diffraction efficiency may not be obtained or the record holding property may deteriorate.

A variety of known radical photopolymerization initiators may be used for the component (c) and a suitable initiator may be selected to match the wavelength of a coherent active energy ray to be used for hologram recording. Preferable radical photopolymerization initiators include bis($\eta^5$-2,4-cyclopentadien-1-yl)bis[2,6-difluoro-3-(1H-pyrrol-1-yl)phenyl]titanium, bis(2,4,6-trimethylbenzoyl)phenylphosphine oxide, and 2,4,6-trimethylbenzoyldiphenylphosphine oxide.

Although the amount of the radical photopolymerization initiator to be added varies with the kind of radical photopolymerization initiator to be used, the concentration of radically polymerizable groups to be introduced to the polymer matrix, and the amount of the radically polymerizable compound to be added and cannot be decided in a general way, it is preferably in the range of 0.05-10 wt %, more preferably in the range of 0.1-5 wt %, of the hologram recording material as a whole.

It is allowable to incorporate, in addition to the aforementioned components, a non-reactive compound that is compatible with the polymer matrix and does not react with the aforementioned components as component (d) to the hologram recording material or a precursor thereof of this invention. Here, the non-reactive compound refers to a compound which does not substantially participate in the reaction for forming the polymer matrix or in the radical photopolymerization reaction at the time of hologram recording and it is selected from compounds which are compatible with the polymer matrix. Such non-reactive compounds include plasticizers, viscosity modifiers, and anti-foaming agents and plasticizers are preferred. The conceivable role of plasticizers is to assist the diffusion of the radically polymerizable components into the hologram recording material and to shorten the time required for the formation of the modulation structure of the refractive index at the time of hologram recording.

It is possible to improve the contrast of the recorded data by selecting a plasticizer having a suitable refractive index. For example, in the case where a compound of high refractive index having an aromatic ring or a sulfur atom in the molecule is used as a radically polymerizable monomer, a plasticizer having a refractive index lower than that of the aforementioned compound of high refractive index by 0.05 or more is preferably selected. Such plasticizers include sebacate esters such as dimethyl sebacate, diethyl sebacate, dibutyl sebacate, and bis(2-ethylhexyl)sebacate, adipate esters such as dimethyl adipate, diethyl adipate, dibutyl adipate, and bis(2-ethylhexyl)adipate, phthalate esters such as dimethyl phthalate, diethyl phthalate, dibutyl phthalate, bis(2-ethylhexyl)phthalate, and diisodecyl phthalate, orthophosphate esters such as trimethyl phosphate, triethyl phosphate, tributyl phosphate, (2-ethylhexyl)phosphate, triphenyl phosphate, cresyl diphenyl phosphate, and tricresyl phosphate and other known plasticizers. In addition, an aprotic polar solvent such as 1,3-dimethyl-2-imidazolidinone can be used suitably as a plasticizer.

Other additives such as sensitizers, chain transfer agents, and stabilizers may also be incorporated.

The volume phase hologram recording material precursor of this invention comprises mainly a polymer matrix-forming material, a radically photopolymerizable compound (b), and a radical photopolymerization initiator (c). Here, the polymer matrix-forming material, the radically photopolymerizable compound (b), and the radical photopolymerization initiator (c) are the same as explained in the section relating the volume phase hologram recording material.

According to this invention, a volume phase hologram recording material is formed from its precursor by polymerizing the precursor by a polymerization reaction other than a radical photopolymerization reaction to yield a polymer matrix.

The volume phase hologram recording medium of this invention is obtained by forming a volume phase hologram recording material on a substrate or between two substrates. Advantageously, a volume phase hologram recording material precursor in the liquid form is laminated on a substrate or placed between two substrates to a prescribed thickness, then the polymer matrix-forming material in the precursor is polymerized by a polymerization reaction other than a radical photopolymerization reaction, and a volume phase hologram recording material thus formed is used as an optical information recording medium for volume phase hologram recording.

The volume phase hologram recording medium of this invention is irradiated with light to form a hologram and the hologram is cured to fix the record. The method of curing is not limited and either photocuring or thermal curing may be used.

The volume phase hologram recording medium of this invention is used by forming a hologram recording medium on a substrate. Concretely, it is formed on a substrate or between two substrates.

According to this invention, a method suitable for the manufacture of a volume phase hologram recording medium in the case where the substrate is made up of one piece consists of applying a composition of volume phase hologram recording material precursor in the liquid form to a substrate such as a glass plate, a polycarbonate plate, a polymethyl methacrylate plate, and a polyester film by a known coating device such as a spin coater, a roll coater, and a bar coater, allowing the composition to polymerize, and forming a polymer matrix without substantially decreasing radically photopolymerizable groups. In this procedure, a protective layer may be provided on a layer of photosensitive resin composition as a membrane to shut off oxygen. Such a protective layer may be, for example, the same as the aforementioned substrate or a film of polyolefin, polyvinyl chloride, polyvinylidene chloride, polyvinyl alcohol, or polyethylene terephthalate or a glass plate.

In the case where the substrate is made up of two pieces, a composition of volume phase hologram recording material precursor is injected into a transparent substrate. A concrete method for such injection consists of arranging a pair of transparent substrates so that transparent substrates become positioned on both sides of a recording layer to be completed and injecting the composition between two transparent substrates. Another method consists of providing an injection hole in a transparent box-like substrate and injecting the composition through this hole. Still another method consists of keeping one face of a transparent box-like substrate open, injecting or dropping the composition into the box-like substrate, and sealing the open face with a transparent substrate.

The volume phase hologram recording medium manufactured in the aforementioned manner can be used in the formation of a volume phase hologram by interference exposure according to the conventional methods. For example, an interference fringe is recorded inside the volume hologram recording medium by two-beam interference exposure in an ordinary exposure apparatus for holography using a laser light or a light of highly coherent nature (capable of displaying stable interference effects), for example, a light having a wavelength of 300 to 1,200 nm. At this stage, the light is diffracted by the recorded interference fringe to provide a hologram. The light sources suitable for the hologram recording material of this invention include a He—Ne laser (633 nm), an Ar laser (515, 488 nm), a YAG laser (532 nm), a He—Cd laser (442 nm), and a blue DPSS laser (405 nm). Furthermore, after the aforementioned hologram recording with one of the aforementioned lasers, the film of an optical information recording composition is either irradiated with ultraviolet rays (UV) over the whole area using a xenon lamp, a mercury lamp, or a metal halide lamp or heated at 60° C. or so to accelerate the polymerization of the unchanged radically polymerizable compound and the phase separation accompanying the mass transfer. In this manner, a hologram showing excellent characteristics is obtained.

EXAMPLES

This invention will be described concretely below with reference to the examples, but it is not limited to these examples. The following symbols are used for the monomers and polymers used in the examples.
DGEPPG: propylene glycol type epoxy resin (SR-TPG manufactured by Sakamoto Yakuhin Kogyo Co., Ltd.)
HDEEBA: hydrogenated bisphenol A type episulfide resin (YL-7007 manufactured by Japan Epoxy Resins Co., Ltd.)
ESF-300S: bisphenolfluorene type episulfide resin (ESF-300S manufactured by Nippon Steel Chemical Co., Ltd.)
PETMP: pentaerythritol tetra(3-mercaptopropionate)
TDMAMP: 2,4,6-tris(dimethylaminomethyl)phenol
DVBP: 3,3'-divinylbiphenyl
MPV: bis(4-vinylthiophenyl)sulfide
DMI: 1,3-dimethyl-2-imidazolidinone
DEEBA: bisphenol A type episulfide resin (XL-7000 manufactured by Japan Epoxy Resins Co., Ltd.)
HDGEBA: hydrogenated bisphenol A type epoxy resin (ST-3000 manufactured by Tohto Kasei Co., Ltd.)
SR-TPG: tripropylene glycol diglycidyl ether
BDTP: butainediol bisthiopropionate
DBU: 1,8-diazabicyclo[5.4.0]undecene-7

The holograms and photosensitive resin compositions in the examples were evaluated with the aid of SHOT-500 and SHOT-500GP manufactured by Pulstec Industrial Co., Ltd.

⟨Evaluation of Hologram⟩

Maximum Diffraction Efficiency (Measured with SHOT-500)

The diffraction efficiency of a transmission type hologram was calculated by the following equation using the value read out with an optical power meter from the diffracted and transmitted light by a linear-polarized He—Ne laser (633 nm).

Diffraction efficiency(%)=[(intensity of diffracted light)/(intensity of transmitted light)+intensity of diffracted light)]×100

The amount of exposure required to obtain the maximum diffraction efficiency was taken as sensitivity.

Multiple Recording Property M/# and Volume Shrinkage (Measured with SHOT-500)

The dynamic range (M#) and volume shrinkage (shrinkage) which are the index of the multiple recording property of a hologram recording material are calculated as follows.

Dynamic range: M/#=Σ√(diffraction efficiency)

Shrinkage (%): calculated from the difference between the angle at the time of recording and the angle at the time of reproduction of a hologram (detuning angle).

Record Holding Property (Measured with SHOT-500GP)

The change in SNR 600 seconds after recording of page data was measured and the record holding property was evaluated as follows; A when the change was within 5%, B when the change was 5-20%, and C when the change was 20% or more.

Example 1

A volume phase hologram recording material precursor was prepared from the following components. First, a mixture of 0.11 g of TDMAMP, 0.28 g of DVBP, and 0.28 g of DMI was prepared and in this mixture was dissolved 0.02 g of bis(η 5-cyclopentadienyl)-bis-[2,6-difluoro-3-(pyrrol-1-yl)phenyl]titanium (Irgacure 784, manufactured by Ciba Specialty Chemicals). Then, 0.15 g of HDEEBA, 1.21 g of DGEPPG, and 0.82 g of PETMP were dissolved to give a solution of a photosensitive composition. This solution served as a volume phase hologram recording material precursor.

The solution of the photosensitive composition was applied to one side of a 1.2 mm-thick glass substrate (provided with a reflection-preventing membrane on both sides) with the aid of a dispenser. Then, the solution applied to the substrate was subjected to defoaming in vacuum until no more bubbles were observed, covered with a glass plate, and the contents were cured in an oven maintained in an inert atmosphere of nitrogen at 50° C. for 24 hours to prepare a photosensitive plate having a 200 μm-thick layer of a volume phase hologram recording material comprising an epoxy-episulfide type polymer matrix. This was used as a volume phase hologram recording medium.

In the recording and reproduction of a hologram, the two-beam interference exposure method with a solid-state continuous laser oscillator (wavelength, 532 nm) was used to generate an interference fringe having a space frequency of approximately 2,500 stripes/mm and the interference fringe was entered from one of the glass plates of the record-evaluating medium to record a volume phase hologram. The exposure of a transmission type hologram was performed until the maximum diffraction efficiency was shown while controlling an optical intensity on the photosensitive plate at 7 mW/cm². The volume phase hologram thus obtained showed a maximum diffraction efficiency of 90%. When the angular multiple recording (49 multiplicity) was performed on the said volume phase hologram recording medium, the dynamic range (M/#) was 3.5 and the curing shrinkage was 0.6% or less.

Examples 2-4 and Comparative Examples 1-4

The photosensitive resin compositions in solution were prepared as in Example 1 with the exception of using the composition shown in Table 1, the volume phase hologram recording materials and the optical information recording media for hologram recording were obtained from the photosensitive compositions, and the holograms were recorded and evaluated. The results are shown in Table 1. Further, the results of FT-IR measurements of the recording materials are shown in FIG. 1. It can be read from FIG. 1 that incorporation of an episulfide compound contributes to the formation of a reactive thiol group in a three-dimensionally crosslinked polymer matrix and the introduction of the thiol group can be controlled by controlling the incorporation of the episulfide compound.

TABLE 1

|  | Example | | | | Comparative Example | | | |
| --- | --- | --- | --- | --- | --- | --- | --- | --- |
|  | 1 | 2 | 3 | 4 | 1 | 2 | 3 | 4 |
| Composition (Part by weight) | | | | | | | | |
| HDEEBA | 5.1 | 12.6 |  | 12.6 |  | 14.3 |  | 48.4 |
| ESF-300S |  |  | 6.8 |  |  |  |  |  |
| DGEPPG | 41.9 | 34.6 | 40.9 | 34.6 | 46.8 | 39.2 | 43.5 |  |
| PETMP | 28.3 | 28.1 | 27.6 | 28.1 | 28.5 | 31.8 | 31.8 | 26.9 |
| TDMAMP | 4 | 4 | 4 | 4 | 4 | 4 | 4 | 4 |
| DMI | 10 | 10 | 10 | 10 | 10 | 10 | 10 | 10 |
| 3,3'-DVBP | 10 | 10 | 10 |  | 10 |  |  | 10 |
| MPV |  |  |  | 10 |  |  | 10 |  |
| irgacure-784 | 0.7 | 0.7 | 0.7 | 0.7 | 0.7 | 0.7 | 0.7 | 0.7 |
| Property | | | | | | | | |
| Appearance | Transparent | Transparent | Transparent | Transparent | Transparent | Transparent | Transparent | Transparent |
| Maximum diffraction efficiency (%) | 90 | 90 | 95 | 90 | 90 | 3 | 85 | 50 |
| Sensitivity (mj/cm$^2$) | 500 | 700 | 500 | 500 | 3000 | 4000 | 2500 | 2000 |
| M/# (200 μm) | 3.5 | 2.0 | 3.8 | 2.5 | 2.5 | — | 2.1 | 1.0 |
| Curing shrinkage (%) | 0.6 | 0.3 | 0.5 | 0.2 | 0.4 | — | 0.2 | 0.2 |
| Record holding property | B | A | A | A | C | — | C | A |

Synthetic Example

In a 3,000-ml flask were placed 1.83 moles (270.7 ml) of divinylbenzene, 1.38 moles (197.8 ml) of ethylvinylbenzene, 1.07 moles of 2-hydroxyethyl methacrylate, and 2,011 ml of toluene (dielectric constant, 2.4) and the mixture was kept at 50° C. To the mixture were added 1.05 moles of ethyl acetate and 1.13 moles (141.9 ml) of boron trifluoride.diethyl ether complex (BF$_3$.OEt$_2$) and the mixture was allowed to react for 3 hours. The polymerization reaction was terminated by methanol, the reaction mixture was mixed with a 0.1M aqueous solution of sodium hydroxide in a separatory funnel, and the unchanged initiator and the catalyst were removed. Then, the organic layer was thrown into a large volume of methanol to separate a soluble aromatic copolymer having a —O—C$_2$H$_4$—OOC—C(CH$_3$)=CH$_2$ group at the end. The copolymer thus obtained was washed with methanol, filtered, dried, and weighed to give 159.9 g of a methacryloyl group-containing soluble aromatic copolymer (b1) (yield, 45.2 wt %). The copolymer (b1) showed an $M_w$ of 6,200, an $M_n$ of 3,700, and an $M_w/M_n$ of 1.67. The NMR analysis showed that the content of the structural unit represented by formula (2) was 58%.

Example 5

The volume phase hologram recording material precursor was prepared from the following components. First, a mixture of 0.15 g of DBU, 1.81 g of the copolymer (b1) obtained in Synthetic Example, 1.81 g of MPV, and 3.61 g of butyl benzoate was prepared and in this mixture was dissolved 0.27 g of bis(η 5-cyclopentadienyl)-bis[2,6-difluoro-3-(pyrrol-1-yl)phenyl]titanium (Irgacure 784, manufactured by Ciba Specialty Chemicals). Then, 1.87 g of HDEEBA, 15.4 g of SR-TPG, and 11.3 g of BDTP were dissolved to give a solution of a photosensitive composition. This solution served as a volume phase hologram recording material precursor.

This solution of the photosensitive composition was applied to one side of a 30 mm×30 mm×1.2 mm glass substrate (provided with a reflection-preventing membrane on both sides) with the aid of a dispenser. Then, the coated substrate was subjected to defoaming in vacuum until no more bubbles were observed, covered with another glass substrate, and the contents were cured in an oven maintained in an inert atmosphere of nitrogen at 50° C. for 24 hours to prepare a photosensitive plate having a 200 μm-thick layer of a volume phase hologram recording material comprising an epoxy.episulfide type linear polymer matrix (binder). This was used as a volume phase hologram recording medium.

In the recording and reproduction of a hologram, the two-beam interference exposure method with a solid-state continuous laser oscillator (wavelength, 532 nm) was used to generate an interference fringe having a space frequency of approximately 1,800 stripes/mm and the interference fringe was entered from one of the glass substrates of the record-evaluating medium to record a volume phase hologram. The exposure of a transmission type hologram was performed until the maximum diffraction efficiency was shown while controlling an optical intensity on the photosensitive plate at 7 mW/cm$^2$. The volume phase hologram thus obtained showed a maximum diffraction efficiency of 55%. When the angular multiple recording (49 multiplicity) was performed on the said volume phase hologram recording medium, the dynamic range (M/#) was 2.1 and the curing shrinkage was 0.6% or less.

Examples 6-9 and Comparative Example 5

The photosensitive compositions in solution were prepared as in Example 5 with the exception of using the compositions shown in Table 2, the volume phase hologram recording media were obtained therefrom, and holograms were recorded and evaluated. The results are shown in Table 2.

TABLE 2

|  | Example | | | | | Comparative Example |
|---|---|---|---|---|---|---|
|  | 5 | 6 | 7 | 8 | 9 | 5 |
| Composition (Part by weight) | | | | | | |
| HDEEBA (Episulfide) | 5.1 | 12.7 | 12.1 |  | 12.1 |  |
| DEEBA (Episulfide) |  |  |  | 5.2 |  |  |
| SR-TPG (Epoxy) | 42.5 | 35.1 |  |  |  |  |
| HDBEBA (Epoxy) |  |  | 37.7 | 44.9 | 37.7 | 62.9 |
| BDTP | 31.3 | 31.1 | 29.1 | 28.8 | 29.1 | 21.1 |
| DBU | 0.4 | 0.4 | 0.4 | 0.4 | 0.4 | 0.3 |
| Copolymer (b1) | 5 | 5 | 5 | 5 |  | 5 |
| MPV | 5 | 5 | 5 | 5 | 10 | 5 |
| Butyl benzoate | 10 | 10 | 10 | 10 | 10 | 5 |
| irgacure-784 | 0.7 | 0.7 | 0.7 | 0.7 | 0.7 | 0.7 |
| Property | | | | | | |
| Appearance | Transparent | Transparent | Transparent | Transparent | Transparent | Transparent |
| Maximum diffraction efficiency (%) | 55 | 65 | 70 | 75 | 68 | 13 |
| Sensitivity (mj/cm$^2$) | 300 | 500 | 150 | 100 | 200 | 3000 |
| M/# (200 μm) | 2.1 | 2.3 | 3.1 | 3.5 | 2.7 | — |
| Curing shrinkage (%) | 0.6 | 0.4 | 0.2 | 0.3 | 1.9 | — |
| Record holding property | B | B | A | A | C | — |

INDUSTRIAL APPLICABILITY

Incorporation of an episulfide compound as a part of a polymer matrix-forming material makes it possible to introduce a thiol group at an arbitrary rate to a polymer matrix that is formed by a polymerization reaction other than a radical photopolymerization reaction. This thiol group in the polymer matrix binds to a radically photopolymerizable compound at the time of hologram recording or acts as a chain transfer agent. Moreover, addition of a soluble aromatic vinyl copolymer as a part of the radically photopolymerizable compound helps to fix strongly the recorded interference pattern. The volume phase hologram recording material of this invention and the volume phase hologram recording medium using the same show high sensitivity, high contrast, and an excellent record holding property. Furthermore, since introduction of a polymer matrix is possible without use of a solvent, the film can be formed at an adequate thickness and the influence of the residual solvent on the recording property is eliminated. Still further, proper use of a linear polymer matrix-forming material which shows good stability of a recording material precursor and a three-dimensionally crosslinked polymer matrix-forming material which shows excellent stability of a recording material can provide a volume phase hologram recording material that can meet a variety of demands.

The invention claimed is:

1. A volume phase hologram recording material comprising mainly a polymer matrix (a), a radically photopolymerizable compound (b), and a radical photopolymerization initiator (c) wherein the polymer matrix (a) is a polymer matrix having a thiol group formed from a polymer matrix-forming material comprising
    0.5-50 wt % of an episulfide compound (f) containing one or more thiirane rings in the molecule,
    an epoxy compound (g) containing one or more oxirane rings and no thiirane rings in the molecule, and
    a curing agent; wherein the thiol group is the only chain transfer agent present (h).

2. A volume phase hologram recording material as described in claim 1 wherein the polymer matrix (a) is a three-dimensionally crosslinked polymer matrix.

3. A volume phase hologram recording material as described in claim 1 wherein the polymer matrix (a) is a linear polymer matrix having a secondary thiol group formed from a polymer matrix-forming material comprising 0.5-50 wt % of an episulfide compound (f2) containing two or less thiirane rings in the molecule, an epoxy compound (g2) containing two or less oxirane rings and no thiirane rings in the molecule, and a bifunctional curing agent (h2).

4. A volume phase hologram recording material as described in claim 1 wherein the episulfide compound (f) containing one or more thiirane rings in the molecule is a compound which has a group represented by the following formula (1) in the molecule and has a molecular weight of 800 or less:

(1)

in formula (1), $R_4$ is a linear hydrocarbon group of 1 to 10 carbon atoms or a single bond, $R^2$, $R^3$, and $R^4$ each is a linear hydrocarbon group of 1 to 10 carbon atoms or a hydrogen atom, and Y is O or S.

5. A volume phase hologram recording material as described in claim 1 wherein the polymer matrix-forming material is a mixture of two kinds or more of compounds including a combination which shows a difference in refractive index of 0.05 or more in absolute value.

6. A volume phase hologram recording material as described in claim 1 wherein the material further comprises at least one kind of non-reactive compound (d) which is compatible with the polymer matrix (a).

7. A volume phase hologram recording material as described in claim 1 wherein the radically photopolymerizable compound (b)

is obtained by polymerizing a divinyl aromatic compound and a monovinyl aromatic compound, has 10-70 mol % of a structural unit represented by the following formula (2)

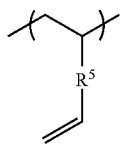

(2)

wherein $R^5$ is an aromatic hydrocarbon group of 6 to 30 carbon atoms and derived from the divinyl aromatic compound and 10-70 mol % of a structural unit derived from the monovinyl aromatic compound, and contains 0.5-30 wt % of a soluble aromatic copolymer (b1) which has a number average molecular weight ($M_n$) of 300-30,000 and a molecular weight distribution ($M_w/M_n$) of 10 or less.

8. A volume phase hologram recording material as described in claim 7 wherein the monovinyl aromatic compound constituting the soluble aromatic copolymer (b1) is an aromatic olefin selected from styrene, vinylnaphthalene, vinylbiphenyl, indene, acenaphthylene, and benzothiophene and derivatives thereof.

9. An optical information recording medium for volume phase hologram recording obtained by forming the volume phase hologram recording material described in any of claims 1 to 8 on a substrate or between two substrates.

10. A volume phase hologram recording material precursor comprising mainly a polymer matrix-forming material, a radically photopolymerizable compound (b), and a radical photopolymerization initiator (c) wherein the polymer matrix-forming material comprises 0.5-50 wt % of an episulfide compound (f) containing one or more thiirane rings in the molecule, an epoxy compound (g) containing one or more oxirane rings and no thiirane rings in the molecule, and a curing agent (h) and the polymer matrix-forming material is polymerized by a polymerization reaction other than a radical photopolymerization reaction to give a polymer matrix having a thiol group; wherein the thiol group is the only chain transfer agent present.

11. A volume phase hologram recording material precursor as described in claim 10 wherein the polymer matrix-forming material comprises 0.5-50 wt % of an episulfide compound (f2) containing two or less thiirane rings in the molecule, an epoxy compound (g2) containing two or less oxirane rings and no thiirane rings in the molecule, and a bifunctional curing agent (h2) and the polymer matrix-forming material is polymerized by a polymerization reaction other than a radical photopolymerization reaction to give a linear polymer matrix having a reactive secondary thiol group.

12. A method for preparing a volume phase hologram recording material comprising mainly a three-dimensionally crosslinked polymer matrix (a), a radically photopolymerizable compound (b), and a radical photopolymerization initiator (c) which comprises polymerizing the volume phase hologram recording material precursor described in claim 10 by a polymerization reaction other than a radical photopolymerization reaction to form a three-dimensionally crosslinked polymer matrix having a thiol group.

\* \* \* \* \*